(12) United States Patent
Hu et al.

(10) Patent No.: US 7,659,193 B2
(45) Date of Patent: *Feb. 9, 2010

(54) CONDUCTIVE STRUCTURES FOR ELECTRICALLY CONDUCTIVE PADS OF CIRCUIT BOARD AND FABRICATION METHOD THEREOF

(75) Inventors: Wen-Hung Hu, Hsin-chu (TW); Ying-Tung Wang, Hsin-chu (TW); Shih-Ping Hsu, Hsin-chu (TW); Chao-Wen Shih, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 63 days.

This patent is subject to a terminal disclaimer.

(21) Appl. No.: 11/588,913

(22) Filed: Oct. 27, 2006

(65) Prior Publication Data

US 2007/0161223 A1 Jul. 12, 2007

(51) Int. Cl.
*H01L 21/44* (2006.01)
(52) U.S. Cl. .............................. 438/614; 257/E23.069; 438/629; 29/852
(58) Field of Classification Search ................ 438/612, 438/613, 614, 625, 629; 257/E23.069, E23.021, 257/E23.02, E21.019, E21.161; 29/842, 29/852
See application file for complete search history.

(56) References Cited

U.S. PATENT DOCUMENTS

| | | | | |
|---|---|---|---|---|
| 6,217,987 B1 * | 4/2001 | Ono et al. | ................... | 428/209 |
| 6,490,170 B2 * | 12/2002 | Asai et al. | ................... | 361/794 |
| 6,613,986 B1 * | 9/2003 | Hirose et al. | ................. | 174/255 |
| 6,828,510 B1 * | 12/2004 | Asai et al. | ................... | 174/255 |
| 7,081,402 B2 * | 7/2006 | Hsu et al. | ................... | 438/612 |
| 7,174,630 B2 * | 2/2007 | Hsu et al. | ..................... | 29/842 |
| 7,350,298 B2 * | 4/2008 | Hsu et al. | ..................... | 29/852 |
| 2005/0017355 A1 * | 1/2005 | Chou et al. | ................. | 257/738 |
| 2005/0037601 A1 * | 2/2005 | Hsu et al. | ................... | 438/612 |
| 2007/0096313 A1 * | 5/2007 | Chou et al. | ................. | 257/737 |

* cited by examiner

*Primary Examiner*—W. David Coleman
*Assistant Examiner*—Su C Kim
(74) *Attorney, Agent, or Firm*—Sawyer Law Group, P.C.

(57) ABSTRACT

Conductive structures for electrically conductive pads of a circuit board and fabrication method thereof are proposed. The fabrication method includes: providing a circuit board with a plurality of first, second and third electrically conductive pads; forming first and second conductive layers on the circuit board; forming first and second resist layers respectively on the first and second conductive layers, the resist layers having a plurality of openings for exposing the conductive layers on the pads; forming a metal layer in the openings of the first and second resist layers; and forming a first connecting layer on the metal layer; forming third and fourth resist layers on the first and second resist layers respectively, the third resist layer having a plurality of openings for exposing the first connecting layer on the metal layer on the second electrically.

21 Claims, 6 Drawing Sheets

CONDUCTIVE STRUCTURES FOR ELECTRICALLY CONDUCTIVE PADS OF CIRCUIT BOARD AND FABRICATION METHOD THEREOF

BACKGROUND OF THE INVENTION

1. Field of the Invention

The present invention relates generally to conductive structures for electrically conductive pads of a circuit board and fabrication method thereof, and more particularly to a fabrication method of different conductive structures for electrically conductive pads on surface of a circuit board for different electronic component connections.

2. Description of Related Art

In a flip chip package, a plurality of electrode pads is disposed on surface of an IC chip and a plurality of solder bumps is formed on the electrode pads. Corresponding to the electrode pads and the solder bumps, a plurality of electrically conductive pads and solder bumps is formed on an organic circuit board such that the IC chip can be disposed on the packaging substrate with its active surface facing down.

Due to increasing demands for electronic products having high speed, high functionality and small size, application field of the flip chip technology is increasing. Meanwhile, in order to further improve electrical performance of the electronic products, passive components such as resistors, capacitors and inductors become necessary in a flip chip package. The passive components are generally disposed on the circuit board by surface mounting technology. As a result, solder bumps and surface mounting component conductive structures exist on the circuit board at the same time. Materials of forming the solder bumps and the surface mounting component conductive structures are designed to be different in height and size so as to match different kinds of electronic components.

The industry usually uses chemical deposition and stencil printing technology to form solder materials on a circuit board.

Figure 1A:
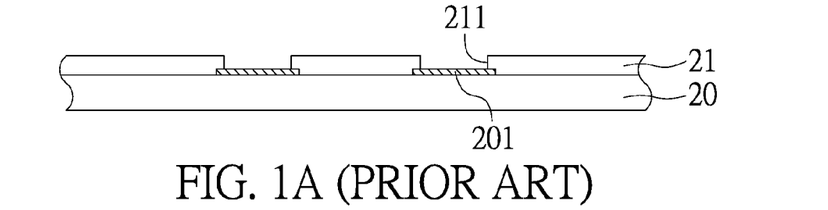
FIGS. 1A to 1E are sectional diagrams showing a conventional method of forming different conductive structures for electrically conductive pads of a circuit board.
Figure 1B:
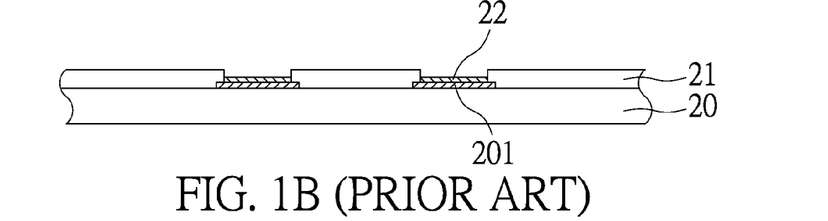
Figure 1C:
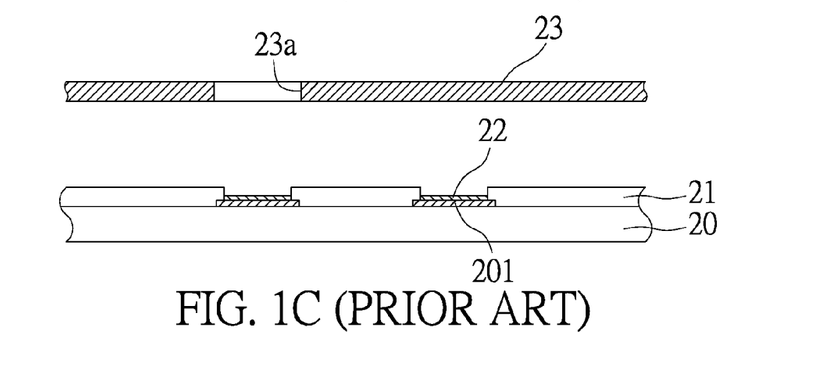
Figure 1D:
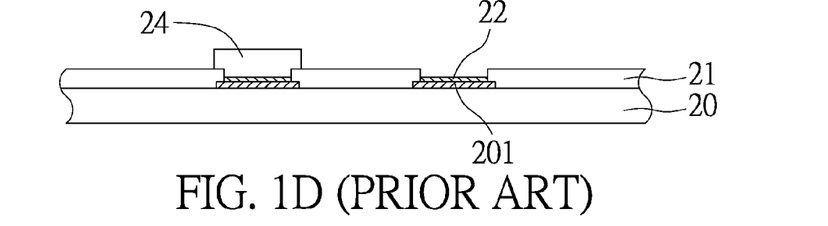
Figure 1E:
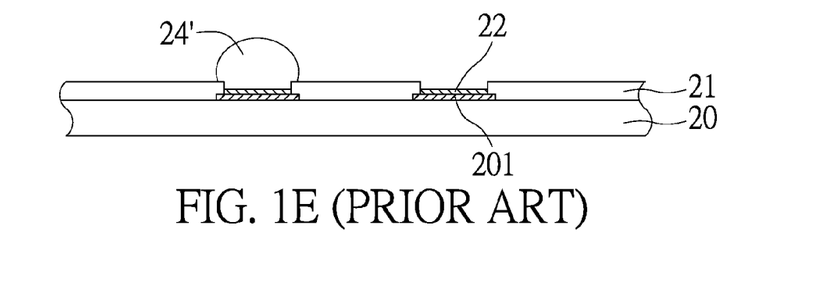

FIGS. 1A to 1E show a conventional method of forming different conductive structures for electrically conductive pads of a circuit board. As shown in FIG. 1A, an organic insulating protection layer 21 is formed on a circuit board 20 having a plurality of electrically conductive pads 201, and then patterned so as to form a plurality of openings 211 for exposing the electrically conductive pads 201. As shown in FIG. 1B, a metal adhesion layer 22 is formed in the openings 211 on the electrically conductive pads 201 by sputtering, evaporation or electroless plating (or called chemical deposition). As shown in FIGS. 1C and 1D, a stencil 23 having grids 23a is used to form solder materials 24 on part of the metal adhesion layer 22 on the electrically conductive pads 201 of the circuit board 20. As shown in FIG. 1E, solder bumps 24' are formed by reflowing the solder materials 24. Thus, the metal adhesion layer and solder bumps made of different material are formed on the electrically conductive pads 201 for different component connections.

However, in the stencil printing process, the higher the solder materials, the more difficult it is to control the height of solder bumps or solder balls in subsequent process. Thereby, solder bumps or solder balls of uneven heights are formed in the reflow process, which adversely affects the electrical connection between the chip and the circuit board. Meanwhile, the stencil printing method can easily cause too much solder material to be melted in the reflow process, which thus leads to bridge phenomenon (solder materials joined together at neighboring electrically conductive pads) and short circuit problem. In addition, it is difficult to provide fine pitch electrically conductive pads through such a method. Moreover, the use of too much solder material is not good for environment.

SUMMARY OF THE INVENTION

In view of the above drawbacks, an objective of the present invention is to provide conductive structures for electrically conductive pads of a circuit board and fabrication method thereof, through which different conductive structures can be provided for different electrical connections of the electrically conductive pads.

Another objective of the present invention is to provide conductive structures for electrically conductive pads of a circuit board and fabrication method thereof, through which fine pitch electrical conductive structure can be formed.

In order to attain the above and other objectives, a fabrication method of conductive structures for electrically conductive pads of a circuit board is proposed, which comprises the steps of: providing a circuit board with a plurality of first and second electrically conductive pads on a first surface thereof and a plurality of third electrically conductive pads on a second surface thereof, and respectively forming a first insulating protection layer and a second insulating protection layer on the first and second surfaces of the circuit board, the first and second insulating protection layers having formed therein a plurality of openings for exposing the first, second and third electrically conductive pads; forming a first conductive layer on the first insulating protection layer and in the openings of the first insulating protection layer, and forming a second conductive layer on the second insulating protection layer and in the openings of the second insulating protection layer; respectively forming a first resist layer and a second resist layer on surfaces of the first and second conductive layers, the first and second resist layers having a plurality of openings so as to respectively expose the first and second conductive layers on surfaces of the first, second and third electrically conductive pads, and forming a first connecting layer in the openings of the first and second resist layers; respectively forming a third resist layer and a fourth resist layer on surfaces of the first and second resist layers to cover the first and third electrically conductive pads, and forming a plurality of openings in the third resist layer so as to expose the first connecting layer on the second electrically conductive pads; and forming a second connecting layer on the first connecting layer on the second electrically conductive pads.

The above fabrication method can further comprise forming a metal layer on surfaces of the first and second conductive layers on the first, second and third electrically conductive pads exposed from the openings of the first and second resist layers. The metal layer can be made of an electroplated copper material.

The first connecting layer can be an electroplated metal adhesion layer made of one of the group consisting of Sn, Ag, Au, Sn/Ag, Sn/Ag/Cu, and Ni/Au. The second connecting layer can be an electroplated solder material made of one of the group consisting of Sn, Ag, Au, Bi, Pb and Zn.

The above fabrication method can further comprise removing the third and fourth resist layers, the first and second resist layers, and the first and second conductive layers covered by the first and second resist layers. Therein, the first, second, third and fourth resist layers can be removed through a chemical method or a physical method. The first and second conductive layers covered by the first and second resist layers can be removed by micro-etching.

According to another embodiment of the present invention, the first connecting layer on the metal layer of the second electrically conductive pads can be removed first and then the second connecting layer is formed on the metal layer, thereby keeping the composition stability of the second connecting layer and meanwhile preventing metal interface problem between the first and second connecting layers.

Therefore, a metal layer and a first connecting layer are formed on the first electrically conductive pads; a metal layer, a first connecting layer and a second connecting layer are formed on the second electrically conductive pads; and a metal layer and a first connecting layer are formed on the third electrically conductive pads. In addition, conductive structures can be directly formed on the electrically conductive pads without the need of forming the metal layer, thereby meeting practical need for different electrical connections.

The first connecting layer made of metal adhesion material on the first electrically conductive pads can be used for surface mounting component connection and the first and second connecting layers on the second electrically conductive pads can be used for semiconductor chip connection. The first connecting layer on the third electrically conductive pads can be used as ball pads of the circuit board. Since the conductive structures of the present invention are formed through electroplating processes, the conventional bottleneck caused by stencil printing method can be overcome. Moreover, since the deposition volume of solder material can be precisely controlled through the electroplating process of the present invention, the bridge phenomenon caused by too much solder material melted in the reflow process can be avoided and the fine pitch electrical conductive structure can be formed.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

FIGS. 2A to 2I show a fabrication method of conductive structures for electrically conductive pads of a circuit board according to a first embodiment of the present invention.

Figure 2A:
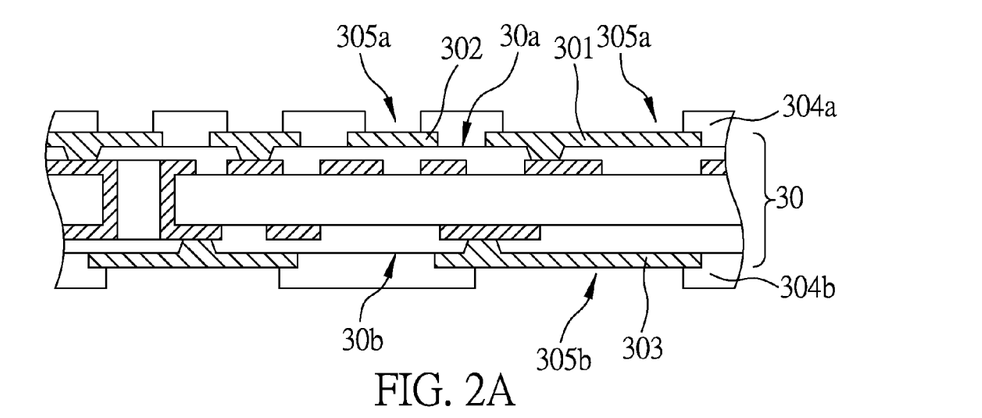
FIGS. 2A to 2I are sectional diagrams showing a fabrication method of forming conductive structures for electrically conductive pads of a circuit board according to a first embodiment of the present invention.

Referring to FIG. 2A, a circuit board 30 having a first surface 30a and a second surface 30b is provided. On the first surface 30a of the circuit board 30, there is formed a plurality of first electrically conductive pads 301 and second electrically conductive pads 302 of different size. On the second surface 30b of the circuit board 30, there is formed a plurality of third electrically conductive pads 303. A first and a second insulating protection layers 304a, 304b are respectively formed on the first and second surfaces 30a, 30b of the circuit board 30, and a plurality of openings 305a, 305b is respectively formed in the first and second insulating protection layers 304a, 304b by a patterning process such as exposure and development so as to expose the first, second and third electrically conductive pads 301, 302, 303. The first and second insulating protection layers can be made of solder mask material such as green paint.

Figure 2B:
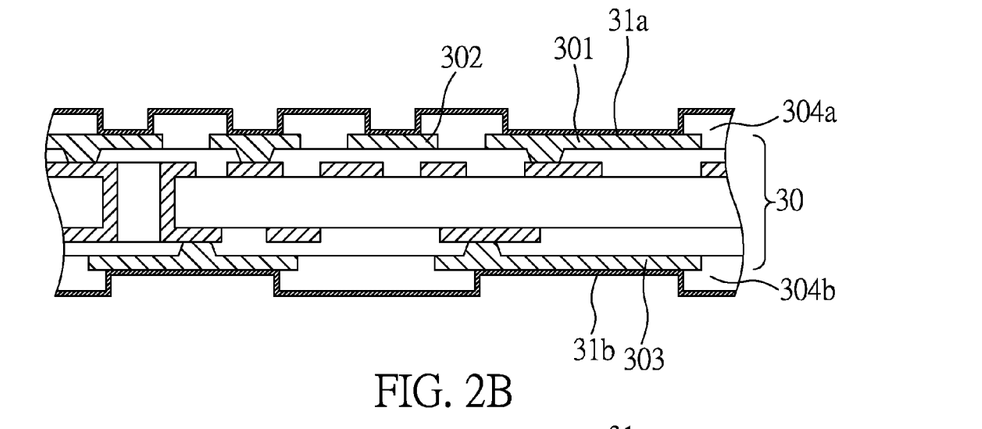

As shown in FIG. 2B, a first conductive layer 31a is formed on the first insulating protection layer 304a and in the openings 305a, and a second conductive layer 31b is formed on the second dielectric layer 305a and the in the opening 305b. The first and second conductive layers 31a, 31b are used as current conductive path for subsequent metal material electroplating process, which can be made of metal, alloy or formed by depositing several metal layers. For example, the first and second conductive layers 31a, 31b can be formed of one of the group consisting of Cu, Sn, Ni, Cr, Ti, Cu—Cr alloy and Sn—Pb alloy by sputtering, evaporating or electroless plating (or called chemical deposition). Alternatively, the first and second conductive layers 31a, 31b can be formed of conductive polymer material such as polyacetylene, polyaniline and organic sulfur polymer by spin coating, ink-jet printing, screen printing or imprinting.

Figure 2C:
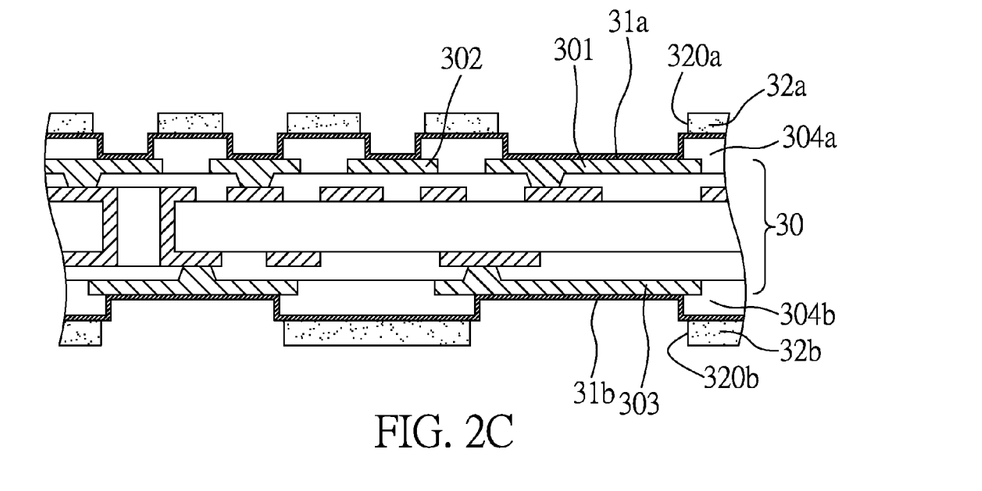

As shown in FIG. 2C, a first and a second resist layers 32a, 32b are respectively formed on the first and second conductive layers 31a, 31b, which respectively have a plurality of openings 320a, 320b for exposing the first and second conductive layers 31a, 31b on the first, second and third electrically conductive pads 301, 302, 303. The first and second resist layers 32a, 32b can be photoresist layers made of such as a dry film or a liquid photo resist, which are formed on surfaces of the first and second conductive layers 31a, 31b by printing, spin coating or attaching and further patterned by exposure and development so as to form the openings 320a, 320b corresponding in position to the first, second and third electrically conductive pads 301, 302, 303.

Figure 2D:
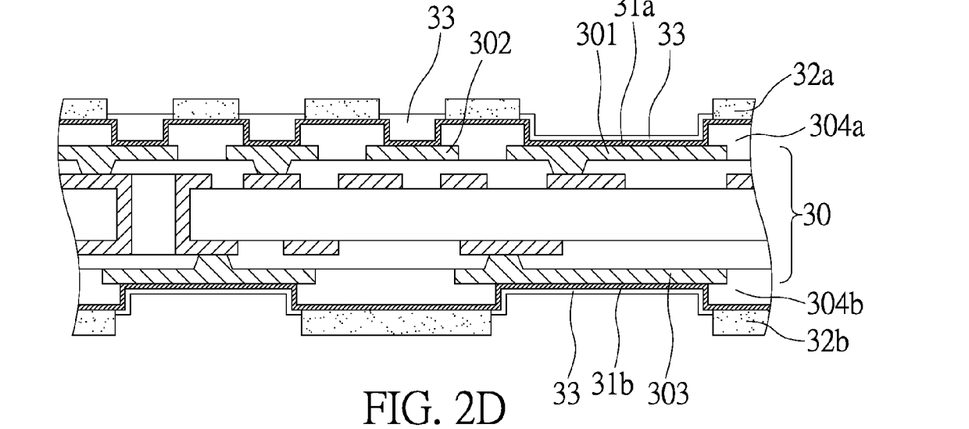

As shown in FIG. 2D, an electroplating process is performed by using the first and second conductive layers 31a, 31b as current conductive path so as to form a metal layer 33 on the exposed first and second conductive layers 31a, 31b on the first, second and third electrically conductive pads 301, 302, 303. Therein, the metal layer 33 can be made of Pb, Sn, Ag, Cu, Au, Bi, Sb, Zn, Ni, Zr, Mg, In, Te or Ga. Preferably, the metal layer 33 is made of electroplated copper since copper is already known as an electroplating material in the art and has a low cost.

Figure 2E:
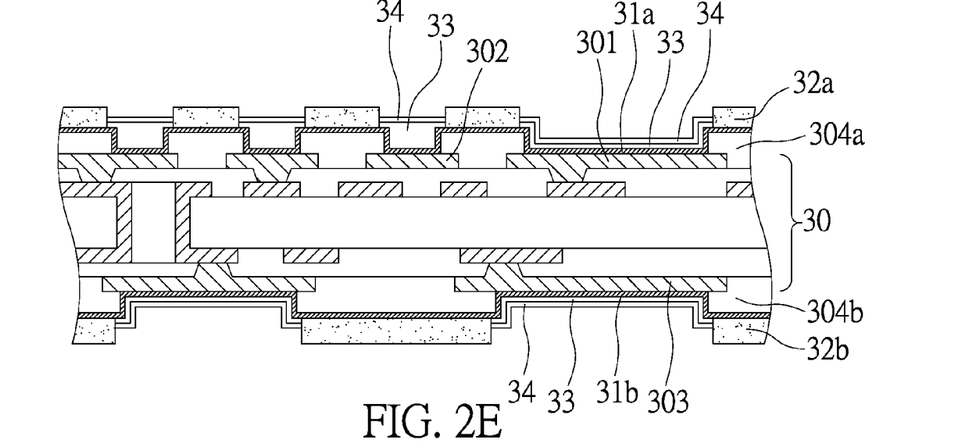

As shown in FIG. 2E, the electroplating process is further performed so as to form a first connecting layer 34 on the metal layer 33. The first connecting layer 34 can be made of an electroplated metal adhesion layer made of one of the group consisting of Sn, Ag, Au, Sn/Ag, Sn/Ag/Cu and Ni/Au.

In addition, in practical process, the electroplated metal adhesion layer can be directly formed in the openings 320a, 320b of the first and second resist layers 32a, 32b as the first connecting layer 34 without the need of forming the metal layer 33.

Figure 2F:
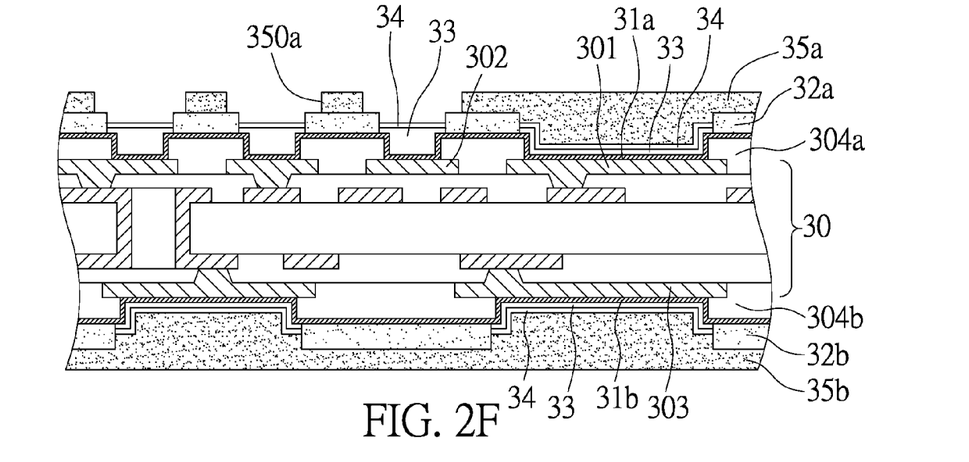

As shown in FIG. 2F, a third and a fourth resist layers 35a, 35b are respectively formed on the first and second resist layers 32a, 32b, wherein, the third and fourth resist layers 35a, 35b cover the first connecting layer 34 on the metal layer 33 on the first and third electrically conductive pads 301, 303.

The third resist layer 35a has a plurality of openings 350a formed corresponding in position to the second electrically conductive pads 302 so as to expose the first connecting layer 34 on the metal layer 33 of the second electrically conductive pads 302. The third and fourth resist layers 35a, 35b can be photoresist layers made of such as a dry film or a liquid photo resist, which are formed on surfaces of the first and second resist layers 32a, 32b by printing, spincoating or attaching. The third resist layer 35a is patterned by exposure and development for forming the openings 350a.

Figure 2G:
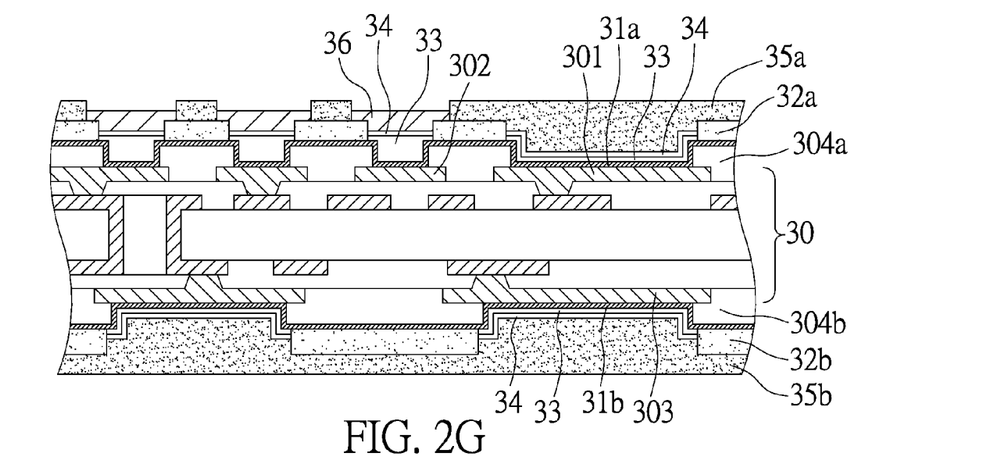

As shown in FIG. 2G, a second connecting layer 36 is formed on surface of the first connecting layer 34 by electroplating. The second connecting layer 36 can be made of an electroplated solder material made of one of the group consisting of Sn, Ag, Au, Bi, Pb and Zn.

Figure 2H:
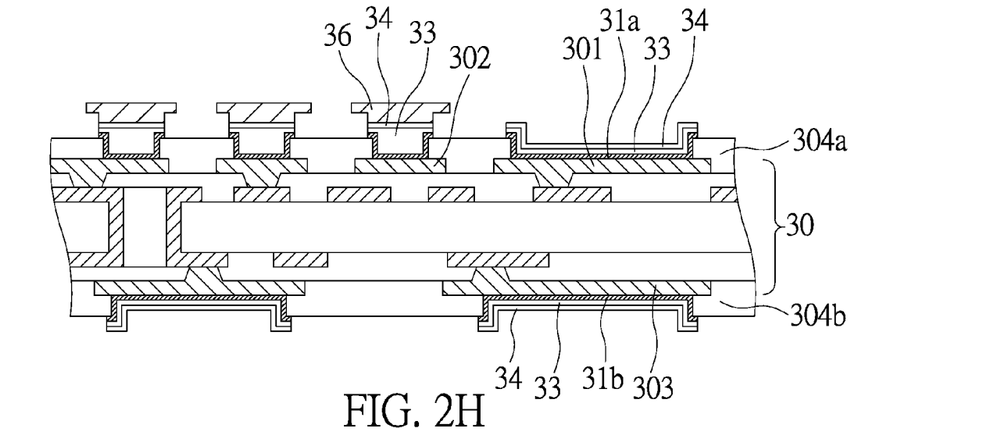

As shown in FIG. 2H, the third, fourth resist layers 35a, 35b and the first, second resist layers 32a, 32b are removed by a physical or a chemical method, and the first, second conductive layers 31a, 31b covered by the first, second resist layers 32a, 32b are removed by micro-etching.

Figure 2I:
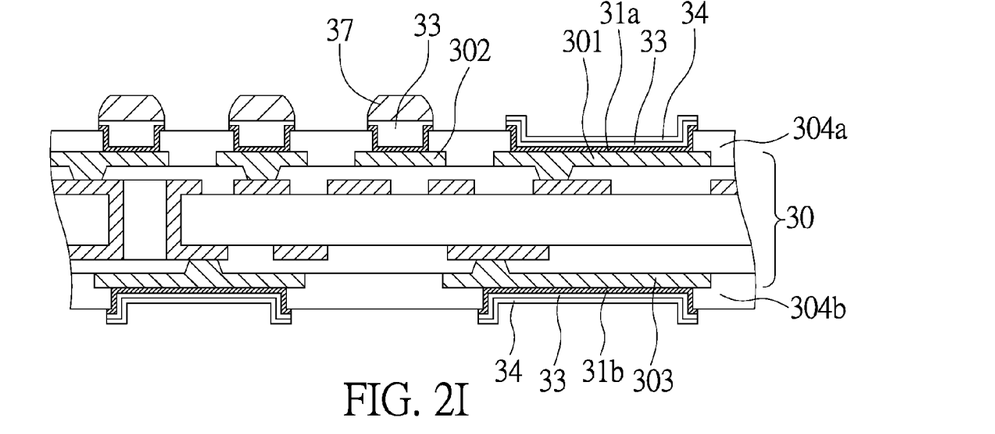

As shown in FIG. 2I, the first and second connecting layers 34, 36 on the second electrically conductive pads 302 are reflowed such that pre-solder bumps 37 covering the metal layer 33 can be formed.

Through the above fabrication process, the first and third electrically conductive pads 301, 303 have the first connecting layer 34 made of an electroplated metal adhesion material formed on the metal layer 33 thereof, and the second electrically conductive pads 302 have the first connecting layer 34 made of an electroplated metal adhesion material and the second connecting layer 36 made of an electroplated solder material formed on the metal layer 33 thereof. Thus, conductive structures of different materials are formed on the first, second and third electrically conductive pads 301, 302, 303. Therein, the metal adhesion material forming the first connecting layer 34 can be one of the group consisting of Sn, Ag, Au, Sn/Ag, Sn/Ag/Cu and Ni/Au. Surface mounting components can be attached to the first connecting layer 34 or alternatively, the first connecting layer 34 can function as ball pads for electrically conductive to the external device such as printed circuit board. The solder material forming the second connecting layer 36 can be one of the group consisting of Sn, Ag, Au, Bi, Pb and Zn. Solder bumps of semiconductor chips shown in the figure can be attached and connected to the second connecting layer 36. Therefore, conductive structures of different materials are used for different purpose of electrical connection.

Second Embodiment

FIGS. 3A to 3D show a fabrication method of conductive structures for electrically conductive pads of a circuit board according to a second embodiment of the present invention. Difference of the present embodiment from the first embodiment is the second connecting layer is formed after the first connecting layer on the metal layer of the second electrically conductive pads is removed. The detailed process is described as follows.

Figure 3A:
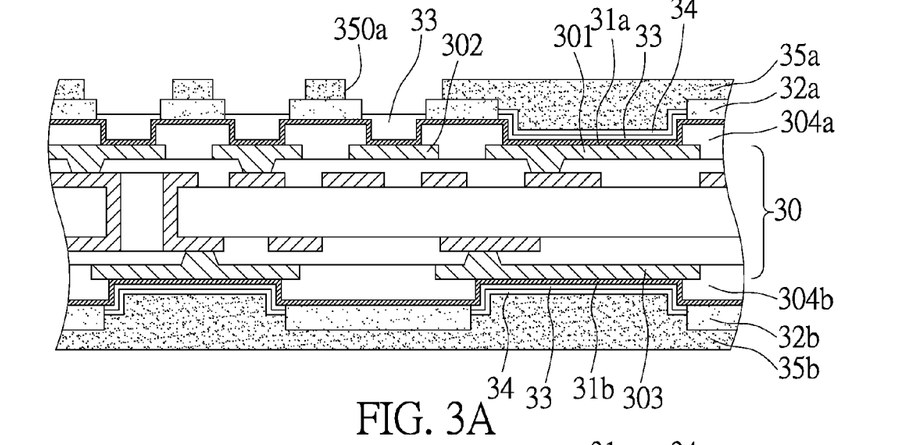
FIGS. 3A to 3D are sectional diagrams showing a fabrication method of forming conductive structures for electrically conductive pads of a circuit board according to a second embodiment of the present invention.

As shown in FIG. 3A, as a succession of the fabrication process in FIG. 2F of the first embodiment, the first connecting layer 34 on the metal layer 33 in the opening 350a of the third resist layer 35a is removed by etching or electrolyzing.

Figure 3B:
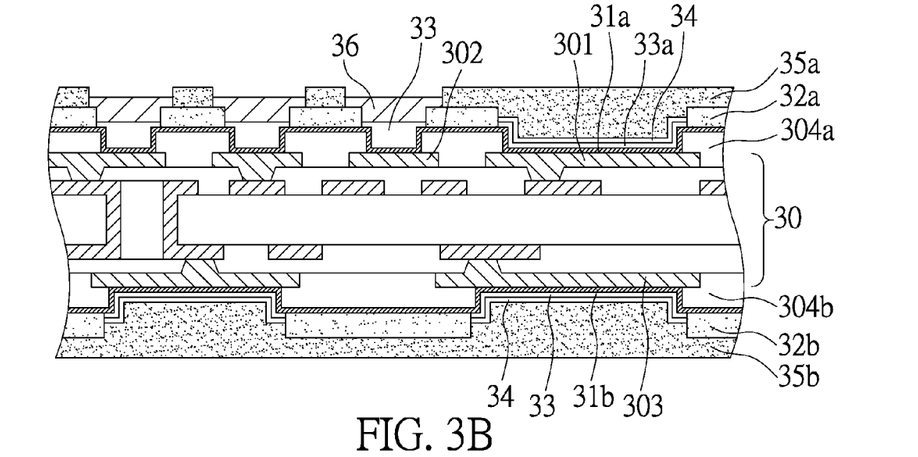

As shown in FIG. 3B, the second connecting layer 36 is formed on the metal layer 33 in the opening 350a of the third resist layer 35a.

Figure 3C:
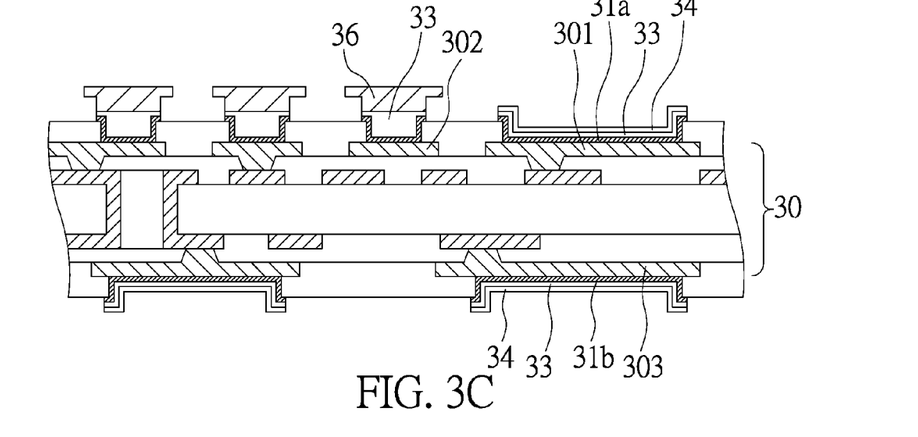

As shown in FIG. 3C, the third, fourth resist layers 35a, 35b and the first, second resist layers 32a, 32b are removed, and the first, second conductive layers 31a, 31b covered by the first, second resist layers 32a, 32b are removed.

Figure 3D:
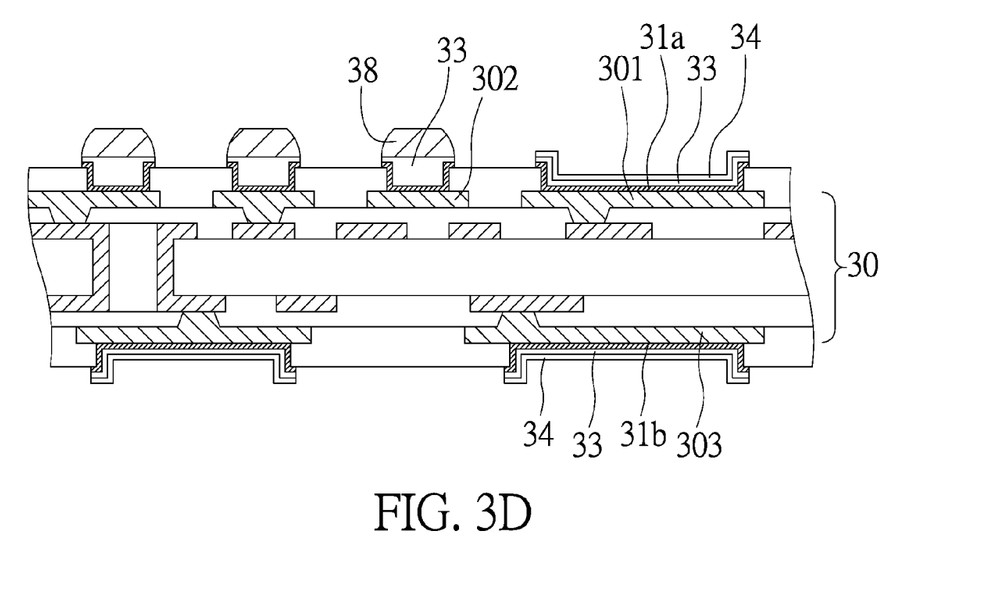

As shown in FIG. 3D, the second connecting layer 36 on the metal layer 33 of the second electrically conductive pads 302 is reflowed so as to form pre-solder bumps 38 covering the metal layer 33.

Still referring to FIG. 3C, the conductive structures for electrically conductive pads of a circuit board proposed by the present invention comprise: a circuit board 30 having first and second surfaces 30a, 30b, the circuit board having a plurality of first and second electrically conductive pads 301, 302 formed on the first surface 30a thereof; a metal layer 33 and a first connecting layer 34 formed on the first electrically conductive pads 301; and a metal layer 33 and a second connecting layer 36 formed on the second electrically conductive pads 302. Further, the second surface 30b of the circuit board 30 has a plurality of third electrically conductive pads 303; and a metal layer 33 and a first connecting layer 34 formed on the third electrically conductive pads 303.

Referring to FIG. 2H, the conductive structures on the second electrically conductive pads 302 of the circuit board further comprise a first connecting layer 34 formed between the metal layer 33 and the second connecting layer 36.

As shown in FIG. 2I or FIG. 3D, pre-solder bumps 37, 38 covering the metal layer 33 are formed by reflowing the second connecting layer 36 on the second electrically conductive pads 302.

Therefore, according to the present invention, a metal layer and a first connecting layer are formed on the first electrically conductive pads; a metal layer, a first connecting layer and a second connecting layer are formed on the second electrically conductive pads; and a metal layer and a first connecting layer are formed on the third electrically conductive pads. In addition, conductive structures can be directly formed on the electrically conductive pads without the need of forming the metal layer, thereby meeting practical need for different electrical connections.

The first connecting layer made of metal adhesion material on the first electrically conductive pads can be used for surface mounting component connection and the first and second connecting layers on the second electrically conductive pads can be used for semiconductor chip connection. The first connecting layer on the third electrically conductive pads can be used as ball pads of the circuit board. Since the conductive structures of the present invention are formed through electroplating processes, the conventional bottleneck caused by stencil printing method can be overcome and the fine pitch electrical conductive structures can be formed.

In addition, before forming the second connecting layer, the first connecting layer on the second electrically conductive pads can be removed first so as to ensure the composition stability of the second connecting layer. Meanwhile, the metal interface problem between the first and second connecting layers can be prevented.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A fabrication method of conductive structures for electrically conductive pads of a circuit board, comprising the steps of:

providing a circuit board with a plurality of first and second electrically conductive pads on a first surface thereof and a plurality of third electrically conductive pads on a second surface thereof, and respectively forming a first insulating protection layer and a second insulating protection layer on the first and second surfaces of the circuit board, the first and second insulating protection layers having formed therein a plurality of openings for exposing the first, second and third electrically conductive pads;

forming a first conductive layer on the first insulating protection layer and in the openings of the first insulating protection layer, and forming a second conductive layer on the second insulating protection layer and in the openings of the second insulating protection layer;

respectively forming a first resist layer and a second resist layer on surfaces of the first and second conductive layers, the first and second resist layers having a plurality of openings so as to respectively expose the first and second conductive layers on surfaces of the first, second and third electrically conductive pads;

electroplating an electroplated metal layer on surfaces of the first and second conductive layers on the first, second and third electrically conductive pads exposed from the openings of the first and second resist layers;

electroplating a first electroplated connecting layer on the surface of the electroplated metal layer;

respectively forming a third resist layer and a fourth resist layer on surfaces of the first and second resist layers to cover the first and third electrically conductive pads, and forming a plurality of openings in the third resist layer so as to expose the first electroplated connecting layer on the second electrically conductive pads; and electroplating a second electroplated connecting layer on the first electroplated connecting layer on the second electrically conductive pads.

2. The fabrication method of claim 1, wherein the electroplated metal layer is made of an electroplated copper material.

3. The fabrication method of claim 1, wherein the first electroplated connecting layer is made of an electroplated metal adhesion layer.

4. The fabrication method of claim 3, wherein, the metal adhesion layer is one of the group consisting of Sn, Ag, Au, Sn/Ag, Sn/Ag/Cu, and Ni/Au.

5. The fabrication method of claim 1, wherein the second electroplated connecting layer is made of an electroplated solder material.

6. The fabrication method of claim 5, wherein the solder material is one of the group consisting of Sn, Ag, Au, Bi, Pb and Zn.

7. The fabrication method of claim 1, further comprising removing the third and fourth resist layers, the first and second resist layers, and the first and second conductive layers covered by the first and second resist layers.

8. The fabrication method of claim 7, wherein the third and fourth resist layers are removed by one of a physical method and a chemical method.

9. The fabrication method of claim 7, wherein the first and second resist layers are removed by one of a physical method and a chemical method.

10. The fabrication method of claim 7, wherein the first and second conductive layers covered by the first and second resist layers are removed by micro-etching.

11. The fabrication method of claim 7, further comprising reflowing the second electroplated connecting layer so as to form pre-solder bumps.

12. The fabrication method of claim 1, wherein the first electroplated connecting layer on the electroplated metal layer on the second electrically conductive pads is removed first and then the second electroplated connecting layer is formed on the electroplated metal layer.

13. Conductive structures for electrically conductive pads of a circuit board, comprising:

a circuit board having a first surface and a second surface, a plurality of first and second electrically conductive pads being formed on the first surface of the circuit board;

a first insulating protection layer respectively formed on the first surface of the circuit board, the first insulating protection layer having formed therein a plurality of openings for exposing the first and second electrically conductive pads;

an electroplated metal layer formed on the first and second electrically conductive pads, wherein an exposing surface area of the electroplated metal layer on each of the first electrically conductive pads is bigger than that of the electroplated metal layer on each of the second electrically conductive pads, and wherein a central portion of the exposing surface of the electroplated metal layer on each of the first electrically conductive pads is recessed in the opening of the first insulating protection layer, and a central portion of the exposing surface of the electroplated metal layer on each of the second electrically conductive pads is protruded from a top surface of the first insulating protection layer;

a first electroplated connecting layer formed on the electroplated metal layer over the first electrically connecting pads for connection of surface mounting components; and a second electroplated connecting layer formed on the electroplated metal layer over the second electrically connecting pads for connection of semiconductor chips.

14. The conductive structures of claim 13, further comprising a plurality of third electrically conductive pads formed on the second surface of the circuit board, wherein the electroplated metal layer and the first electroplated connecting layer are formed on the third electrically conductive pads.

15. The conductive structures of claim 13, further comprising the first electroplated connecting layer formed between the electroplated metal layer and the second electroplated connecting layer on the second electrically conductive pads.

16. The conductive structures of claim 13, wherein the first electroplated connecting layer is made of an electroplated metal adhesion layer.

17. The conductive structures of claim 16, wherein the metal adhesion layer is one of the group consisting of Sn, Ag, Au, Sn/Ag, Sn/Ag/Cu, and Ni/Au.

18. The conductive structures of claim 13, wherein the second electroplated connecting layer is made of an electroplated solder material.

19. The conductive structures of claim 18, wherein the solder material is one of the group consisting of Sn, Ag, Au, Bi, Pb and Zn.

20. The conductive structures of claim 13, wherein the second electroplated connecting layer on the second electrically conductive pads is reflowed so as to form pre-solder bumps covering the electroplated metal layer.

21. The conductive structures of claim 15, wherein the second electroplated connecting layer on the second electrically conductive pads is reflowed so as to form pre-solder bumps covering the electroplated metal layer.

* * * * *